United States Patent
Ho (10) Patent No.: US 9,374,930 B2
(45) Date of Patent: Jun. 21, 2016

(54) FAN HOLDING STRUCTURE, HEAT-DISSIPATING MODULE WITH THE FAN HOLDING STRUCTURE AND ELECTRONIC DEVICE HAVING THE SAME

(71) Applicants: LITE-ON ELECTRONICS (GUANGZHOU) LIMITED, Guangzhou (CN); LITE-ON TECHNOLOGY CORPORATION, Taipei (TW)

(72) Inventor: Chun-Lung Ho, Hsinchu County (TW)

(73) Assignees: LITE-ON ELECTRONICS (GUANGZHOU) LIMITED, Guangzhou (CN); LITE-ON TECHNOLOGY CORPORATION, Taipei (TW)

(*) Notice: Subject to any disclaimer, the term of this patent is extended or adjusted under 35 U.S.C. 154(b) by 0 days.

(21) Appl. No.: 14/583,570

(22) Filed: Dec. 26, 2014

(65) Prior Publication Data

US 2015/0282384 A1   Oct. 1, 2015

(30) Foreign Application Priority Data

Mar. 28, 2014   (CN) .................... 2014 2 0149325 U (51) Int. Cl.
*H05K 7/20* (2006.01)
*F16B 2/22* (2006.01)

(52) U.S. Cl.
CPC .............. *H05K 7/20172* (2013.01); *F16B 2/22* (2013.01); *Y10T 24/44256* (2015.01)

(58) Field of Classification Search
CPC . H05K 7/20; H05K 7/20172; H05K 7/20581; G06F 1/20; G06F 1/183; H01L 23/34; H01L 23/467; H01L 23/4093; F04D 25/12; F04D 25/166; F16B 2/22

USPC ......... 361/679.46–679.5, 690–697, 704–712, 361/715–722; 165/80.2, 80.3, 104.33, 165/121–126; 415/121.1, 213.1, 214.1, 415/232; 248/638; 454/184; 417/360, 417/423.5–423.25; 312/223.2, 236, 265
See application file for complete search history.

(56) References Cited

U.S. PATENT DOCUMENTS

| | | | | |
|---|---|---|---|---|
| 5,707,282 A | * | 1/1998 | Clements | H05K 7/20172 361/679.48 |
| 5,713,790 A | * | 2/1998 | Lin | H05K 7/20172 361/695 |
| 6,215,659 B1 | * | 4/2001 | Chen | G06F 1/20 165/122 |
| 6,330,156 B1 | * | 12/2001 | Cresse | G06F 1/183 165/122 |
| 6,341,644 B1 | * | 1/2002 | Lo | H01L 23/4093 165/80.3 |
| 6,826,048 B1 | * | 11/2004 | Dean | F04D 29/601 165/122 |

(Continued)

*Primary Examiner* — Michail V Datskovskiy
(74) *Attorney, Agent, or Firm* — Li & Cai Intellectula Property (USA) Office (57) ABSTRACT

A heat-dissipating module including a fan holding structure and a fan is disclosed. The fan holding structure includes: a carrying body, at least one resilient clamping member, at least one resilient engaging member, and a plurality of resilient fixing members. The at least one resilient clamping member and the resilient fixing members are arranged on the carrying body. An electronic device includes an opening and at least one engaging member. The resilient engaging member corresponds to the engaging member, so that the heat-dissipating module with the fan holding structure is detachably arranged at the opening. The fan of the heat-dissipating module can be quickly and effectively detached and attached through the at least one resilient clamping member and the resilient fixing members.

21 Claims, 8 Drawing Sheets

(56) References Cited

U.S. PATENT DOCUMENTS

| | | | | |
|---|---|---|---|---|
| 7,038,913 B2* | 5/2006 | Lee | ................. | H01L 23/467 |
| | | | | 165/185 |
| 8,608,438 B2* | 12/2013 | Shu | ................. | G06F 1/183 |
| | | | | 415/213.1 |
| 8,784,167 B2* | 7/2014 | Yi | ................. | H05K 7/20172 |
| | | | | 361/679.49 |
| 2009/0147473 A1* | 6/2009 | Yi | ................. | H05K 7/20172 |
| | | | | 361/695 |
| 2012/0087790 A1* | 4/2012 | Zeng | ................. | F04D 25/0613 |
| | | | | 415/213.1 |
| 2012/0156030 A1* | 6/2012 | Shu | ................. | G06F 1/20 |
| | | | | 415/213.1 |
| 2013/0142644 A1* | 6/2013 | Zeng | ................. | H05K 7/20172 |
| | | | | 415/220 |

* cited by examiner

FAN HOLDING STRUCTURE, HEAT-DISSIPATING MODULE WITH THE FAN HOLDING STRUCTURE AND ELECTRONIC DEVICE HAVING THE SAME

BACKGROUND OF THE INVENTION

1. Field of the Invention

The invention relates to a heat-dissipating module and an electronic device having the heat-dissipating module and, in particular, to a heat-dissipating module having a fan holding structure that is able to simplify a fan assembly, and an electronic device having the heat-dissipating module which can be quickly detached from a housing of the electronic device.

2. Description of Related Art

In recent years, with the rapid progress of computer technology, the operating speed of computer continuously improves, the rate of heat generated of electronic components within a host computer is also on a constant rise. CPU and power supply are two main heat sources in the host computer, and it is common practice in the art to install a heat-dissipating module including, for example, a fan and heat-dissipating fins, on the CPU and power supply to achieve the heat dissipation effect of the host computer.

However, the heat-dissipating module currently attached on the server housing has other inconveniences. For example, the conventional manner for assembling and installing the heat-dissipating module to computer requires a lot of screws that can cost time and money. Due to the small sizes of screws, they are inconvenient to use and can be easily lost. When fan replacement is needed due to a failure, the user must spend a lot of time detaching and installing the fan. Moreover, since the fan is consumer product, used in actual applications, the fan needs to be frequently replaced. Therefore, it is desirable to find a way to quickly replace a fan without interrupting the operation of a computer and without risking destruction of the CPU due to excessive heat.

Furthermore, the fan is conventionally fastened by screws. When screw holes of the fan are too large due to the poor control over the manufacturing tolerance, the fan will not be securely fixed on the server housing. During operation, vibrations and loud noise will be generated from the loosely fixed fan. In other words, it is desirable to minimize vibrations and noises coming off from the heat-dissipating module due to the poor control over the manufacturing tolerance of the screw holes on the fan during manufacturing process without being a nuisance to the user. In summary, the conventional screw and hole setup poses a major inconvenience to users and a solution is highly desirable.

Accordingly, this invention which has a reasonable design and can effectively improve upon the abovementioned problems has been proposed by the inventors based on intensive research in combination with theoretical knowledge.

SUMMARY OF THE INVENTION

The object of the invention is to provide a fan holding structure, a heat-dissipating module having the fan holding structure and an electronic device having the heat-dissipating module which can be quickly detached and attached from the electronic device without the use of screws while reducing loud vibrations and noise during operation of the fan.

In order to achieve the aforementioned objects, according to an embodiment of the invention, a heat-dissipating module is provided, which includes: a fan holding structure and a fan. The fan holding structure includes: a carrying body, at least one resilient clamping member, and a plurality of resilient fixing members. The carrying body has a vent. The at least one resilient clamping member is arranged on the carrying body at a peripheral portion of the vent, and extends vertically from a surface of the carrying body. The plurality of resilient fixing members is arranged on the carrying body at a peripheral portion of the vent, and extends vertically from the surface of the carrying body. The fan has a plurality of mounting holes corresponding to the resilient fixing members of the carrying body, whereby the fan is detachably arranged on the fan holding structure. When the fan is arranged on the carrying body, the resilient fixing members are engaged in the respective mounting holes of the fan, and the at least one resilient clamping member is abutted against a sidewall of the fan.

In order to achieve the aforementioned objects, according to another embodiment of the invention, an electronic device is provided, which includes: a housing and a heat-dissipating module. The housing has an opening and at least one engaging portion arranged around the opening. The heat-dissipating module is detachably arranged at the opening of the housing and includes a fan holding structure and a fan removably attached on the fan holding structure. The fan holding structure includes: a carrying body, at least one resilient clamping member, a plurality of resilient fixing members, and at least one resilient engaging member. The carrying body has a vent. The at least one resilient clamping member is arranged on the carrying body, and extends vertically from a surface of the carrying body. The plurality of resilient fixing members is arranged on the carrying body, and extends vertically from the surface of the carrying body. The at least one resilient engaging member is arranged on a side edge of the carrying body. The fan has a plurality of mounting holes corresponding to the respective resilient fixing members. Each of the resilient fixing members is correspondingly engaged in one of the mounting holes of the fan when the fan is arranged on the carrying body, and the at least one resilient clamping member is abutted against a sidewall of the fan. The heat-dissipating module is engaged with or disengaged from the engaging portion of the housing through the resilient engaging members.

In order to further the understanding regarding the features and technical contents of the invention, the following embodiments and appended drawings are provided along with illustrations to facilitate the disclosure of the invention. The drawings are provided for illustrative purposes only and not intended to limit the invention.

DETAILED DESCRIPTION OF THE PREFERRED EMBODIMENTS

The embodiments of a heat-dissipating module and an electronic device having the heat-dissipating module of the invention are described below by means of specific examples, and other advantages and objectives of the invention can be easily understood by one skilled in the art from the disclosure of the description. The invention can be embodied or applied in other different embodiments, and various modifications and variations can be made to various details in the description for different applications without departing the scope of the invention. Also, the drawings of the invention are provided for only simple illustration, and are not drawn to scale, that is, do not reflect the actual relative dimensions.

The following embodiments are provided to describe in detail the concept of the invention, and are not intended to limit the scope thereof in any way.

Figure 1:
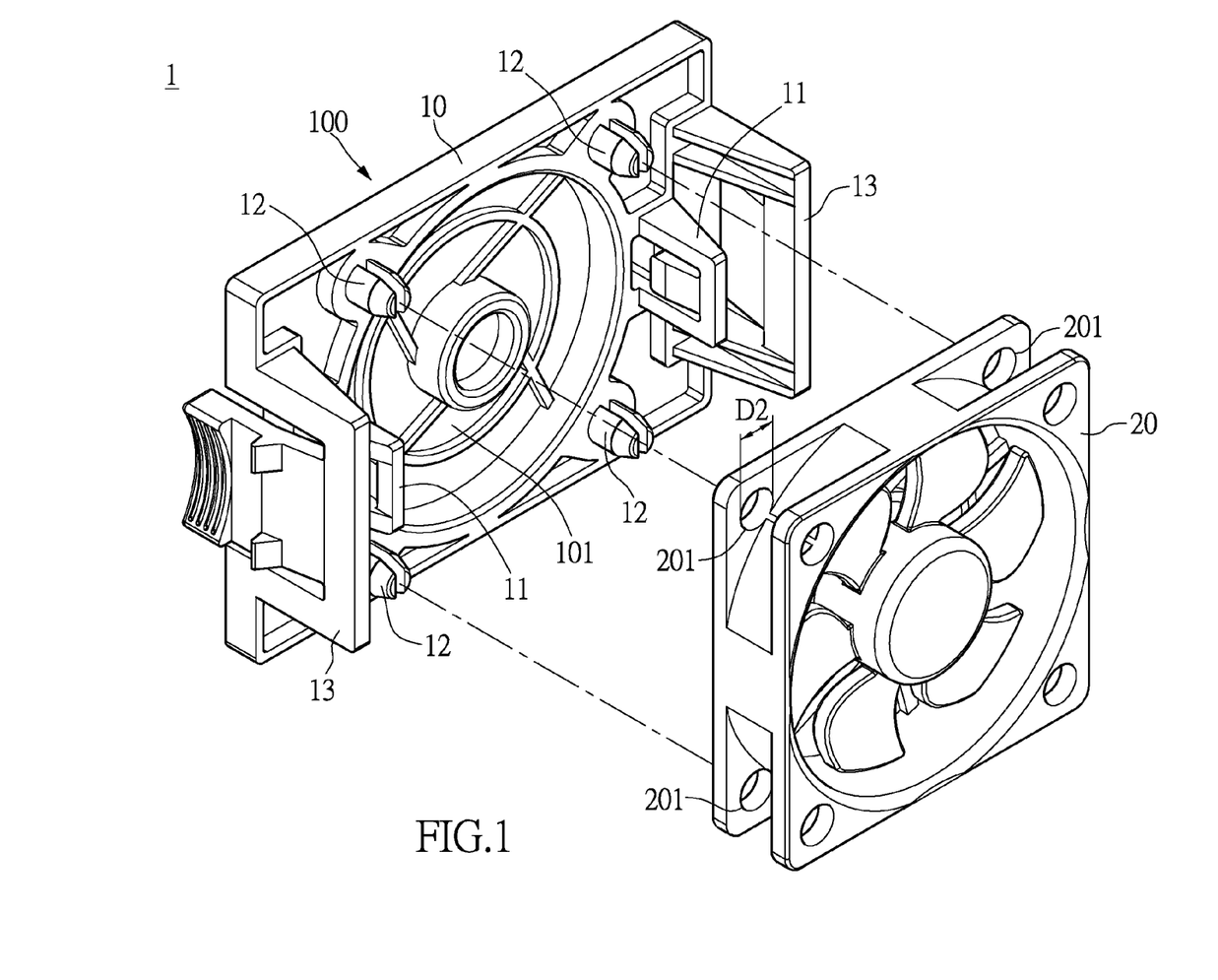
FIG. 1 shows an exploded schematic diagram of a heat-dissipating module of the invention.
Figure 2:
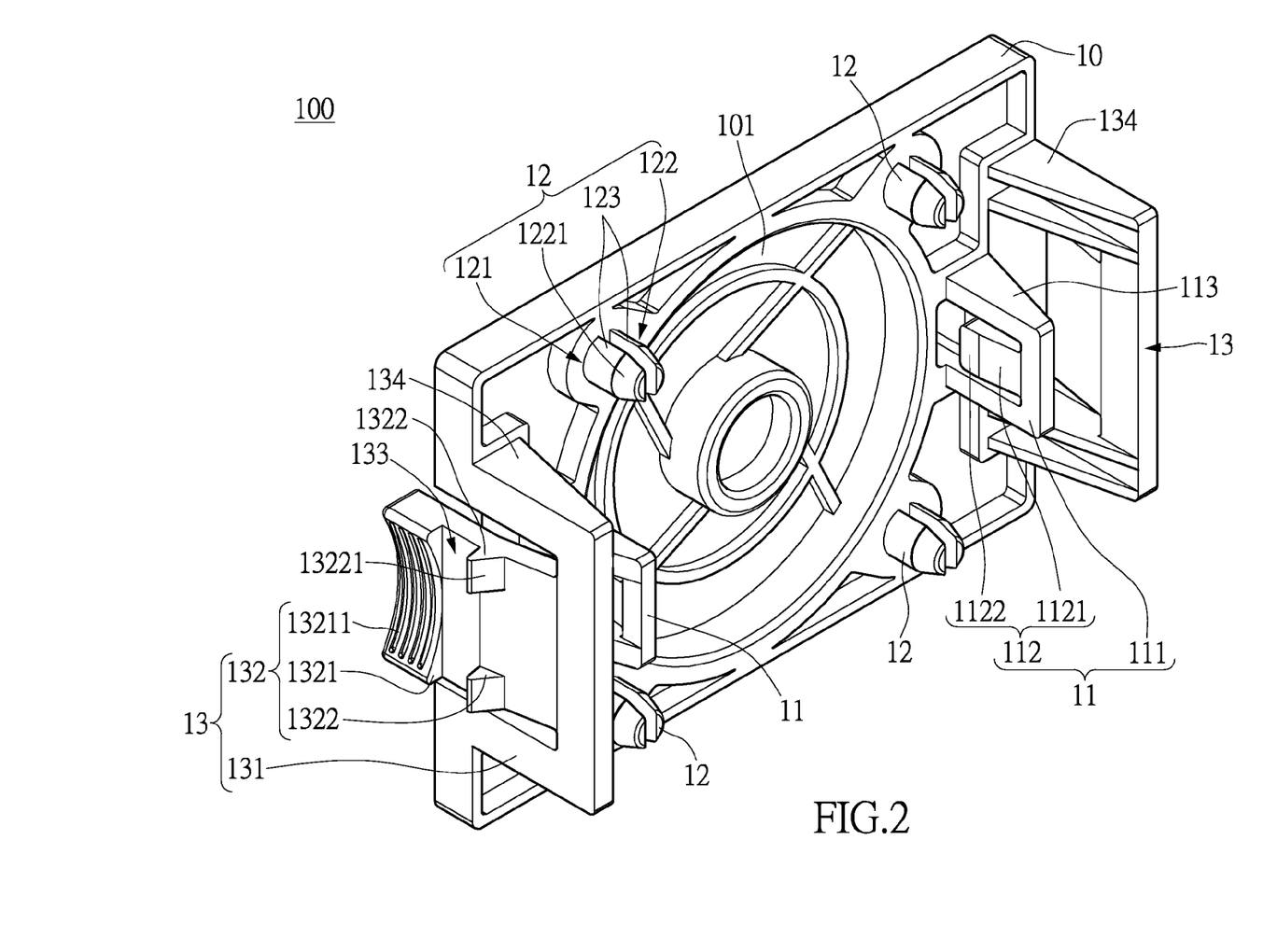
FIG. 2 shows a schematic diagram of a fan holding structure of the heat-dissipating module of the invention.

Referring to FIGS. 1 to 5 which show schematic diagrams of a heat-dissipating module according to an embodiment of the invention. As shown in FIG. 1 and FIG. 2, the heat-dissipating module 1 includes: a fan holding structure 100 and a fan 20. The fan 20, including a fan blade, a frame and a plurality of mounting holes 201 formed on the frame, is detachably arranged on the fan holding structure 100. The fan holding structure 100 includes: a carrying body 10, at least one resilient clamping member 11, a plurality of resilient fixing members 12, and at least one resilient engaging member 13. The fan holding structure 100 is made of plastic, wood, metal, or acrylic and so on, so that the fan holding structure 100 has certain resilience, and the fan holding structure 100 may be fabricated in one-piece.

Specifically, the carrying body 10 has a vent 101 corresponding to an air in-flow opening (e.g. air outlet or air inlet) of the fan 20. The at least one resilient clamping member 11 and the resilient fixing members 12 are arranged on the same surface of the carrying body 10 at a peripheral portion of the vent 101. Preferably, the number of the resilient fixing members 12 may be four, which are spaced from each other and symmetrically arranged, and are respectively arranged near four corners of the carrying body 10 proximate to the vent 101 as shown in FIG. 1. The resilient fixing members 12 are arranged corresponding in number and position to mounting holes 201 of the fan 20. The number of the at least one resilient clamping member 11 may be two, which are arranged opposed to each other. It should be noted that the numbers and positions of the resilient clamping members 11 and the resilient fixing members 12 are not limited to the example provided herein and can be changed according to the practical requirements. For example, in other embodiments, they can be three symmetrically arranged resilient clamping members 11 and resilient fixing members 12. The at least one resilient engaging member 13 is arranged on the side edges of the carrying body 10, and can be arranged on the same surface of the carrying body 10 as the resilient clamping members 11. In the instant embodiment, taking two resilient engaging members 13 as an example shown in the figures, they are arranged opposed to each other on the carrying body 10. However, the number and position of the resilient engaging members 13 are not limited to the examples provided herein, and can be changed according to the practical requirements. For example, in other embodiments, one resilient engaging member 13 may be provided.

In particular, each of the resilient clamping members 11 includes a clamping frame 111 and a resilient clamping arm 112. The clamping frame 111 is fixedly arranged on the carrying body 10 and extends vertically from one surface of the carrying body 10, and the resilient clamping arm 112 is resiliently arranged on the clamping frame 111 and a portion of the resilient clamping arm 112 is exposed from the clamping frame 111 in a direction towards a central axis of the carrying body 10. For example, one end of the resilient clamping arm 112 is fixedly arranged on the clamping frame 111, whereas the other end is freely exposed from the clamping frame 111. The exposed part of the resilient clamping arm 112 includes a guiding surface 1121 and a clamping surface 1122. The guiding surface 1121 and the clamping surface 1122 are joined together, and the clamping surface 1122 facing the central axis of the carrying body 10 is arranged adjacent to the carrying body 10. The guiding surface 1121 can be a slanted surface, and the slanted surface faces the central axis of the carrying body 10, and the clamping surface 1122 can be generally a flat surface or rough surface substantially perpendicular to the carrying body 10, depending on the profile design of the fan 20. It should be particularly noted that the resilient clamping members 11 of the instant embodiment including the clamping frame 111 and the resilient clamping arm 112 are only described as an example and the structure of the resilient clamping members 11 is not limited to this in practical applications. For example, the resilient clamping member 11 can also be a single component resembling a hook shape.

The resilient fixing members 12 are arranged on the carrying body 10. Preferably, the resilient fixing members 12 extend vertically from a surface of the carrying body 10, and can be made of plastic, wood, metal, or acrylic and so on, in order to provide a certain extend of resilience. Each of the resilient fixing members 12 includes two or more separate resilient arms 123 (for example, two in the instant embodiment as shown in the figures), and the gaps formed therebetween provide a sufficient space for the resilient arms 123 upon elastic displacement. Each of the resilient arms 123 has a fixed end 121 and a free end 122. The fixed end 121 is fixedly arranged on the surface of the carrying body 10, and the free end 122 has a guiding surface 1221 which can be a slanted surface. Each resilient fixing member 12 in the figures is exemplified as including two semi-cylindrical shaped pillar structures, and is not limited hereto.

Each of the resilient engaging members 13 includes an engaging fixing frame 131 and a resilient engaging arm 132. The engaging fixing frame 131 is fixedly arranged on one side edge of the carrying body 10, and extends vertically from one surface of the carrying body 10. One end of the resilient engaging arm 132 is resiliently arranged on the engaging fixing frame 131. For example, one end of the resilient engaging arm 132 is fixedly arranged on the engaging fixing frame 131, whereas the other end is freely exposed from the side edge of the engaging fixing frame 131 and the carrying body 10 and away from the carrying body 10. The exposed part of the resilient engaging arm 132 has a pressing portion 1321 and an engaging portion 1322. The pressing portion 1321 and the engaging portion 1322 are bumps extending outwardly from the resilient engaging arm 132, and accordingly, an engaging slot 133 is formed between the pressing portion 1321 and the engaging portion 1322. The resilient engaging member 13 in the figures is exemplified as including two engaging portion 1322. Preferably, the engaging portion 1322 of the resilient engaging member 13 has a guiding surface 13221 which can be a slanted surface. The pressing portion 1321 has a curved structure 13211, and preferably adopts a non-slip design for convenient pressing by users. However, the number and configuration of the pressing portion 1321 and engaging portion 1322 are not limited to the examples provided herein, and can be changed according to the practical requirements. For example, in other embodiments, one engaging portion 1322 can be provided. In addition, the resilient engaging members 13 of the instant embodiment are exemplary as being integrally formed with the carrying body 10, and the resilient engaging member 13 itself provides resilient engagement that can clip and release the housing 30. However, in other embodiments, the resilient engaging member 13 is not limited to the examples provided herein and can be a component independent of the carrying body 10 that is pivoted to a side edge of the carrying body 10, and an additional elastic member (e.g. a torsion spring, not shown) can provide resilient engagement.

Figure 3:
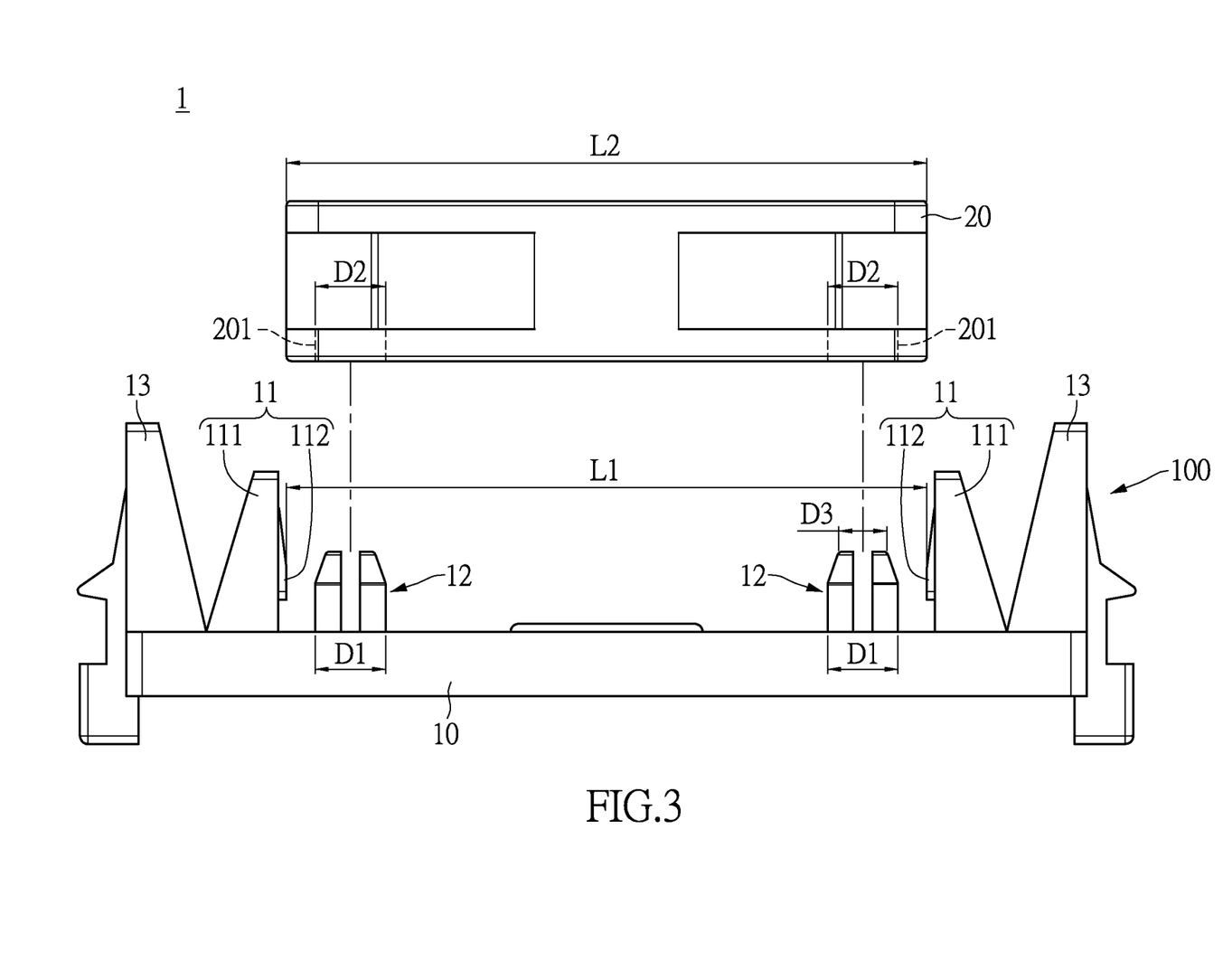
FIG. 3 shows an exploded top view of the heat-dissipating module of the invention.
Figure 4:
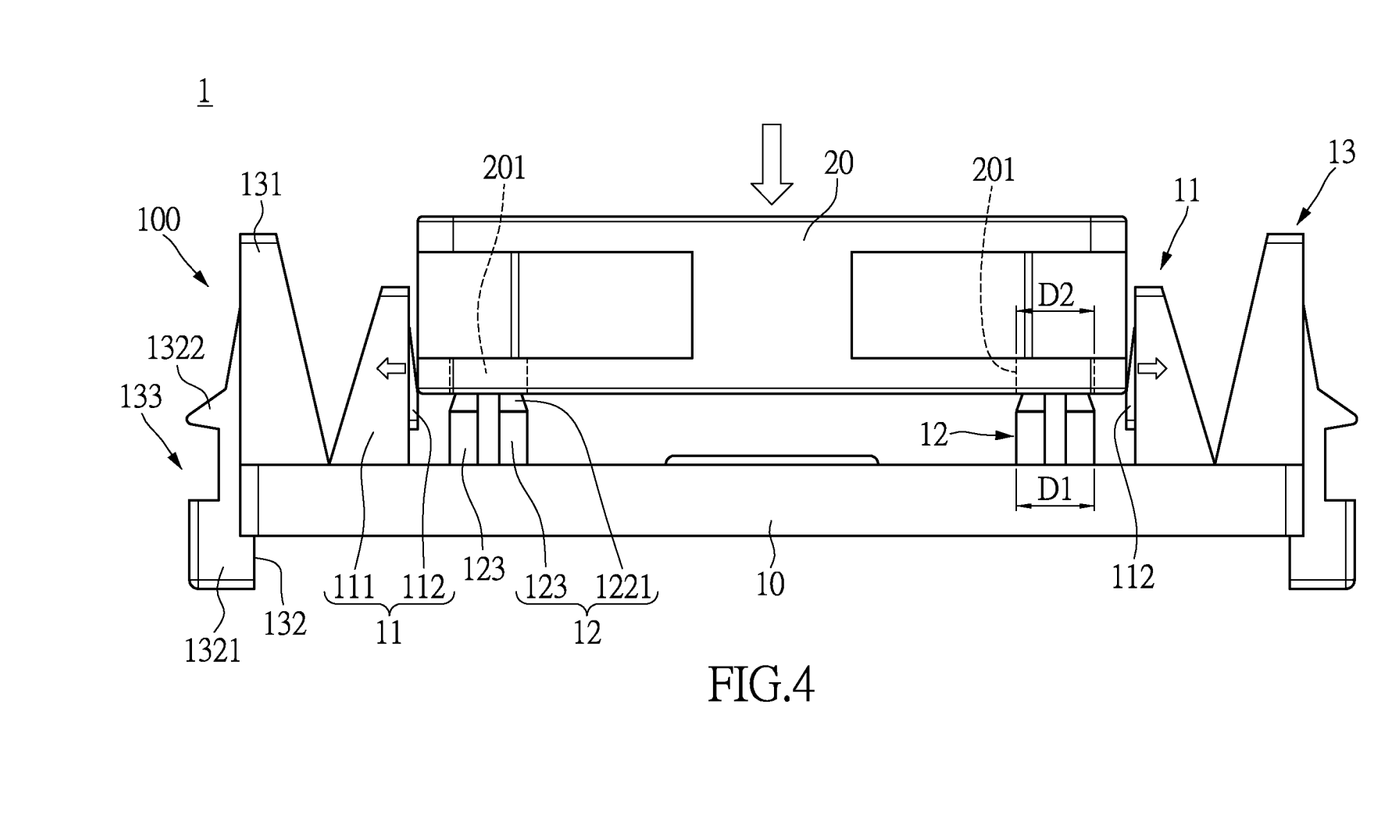
FIG. 4 shows a top view of a first assembly of the fan holding structure and the fan of the heat-dissipating module of the invention.
Figure 5:
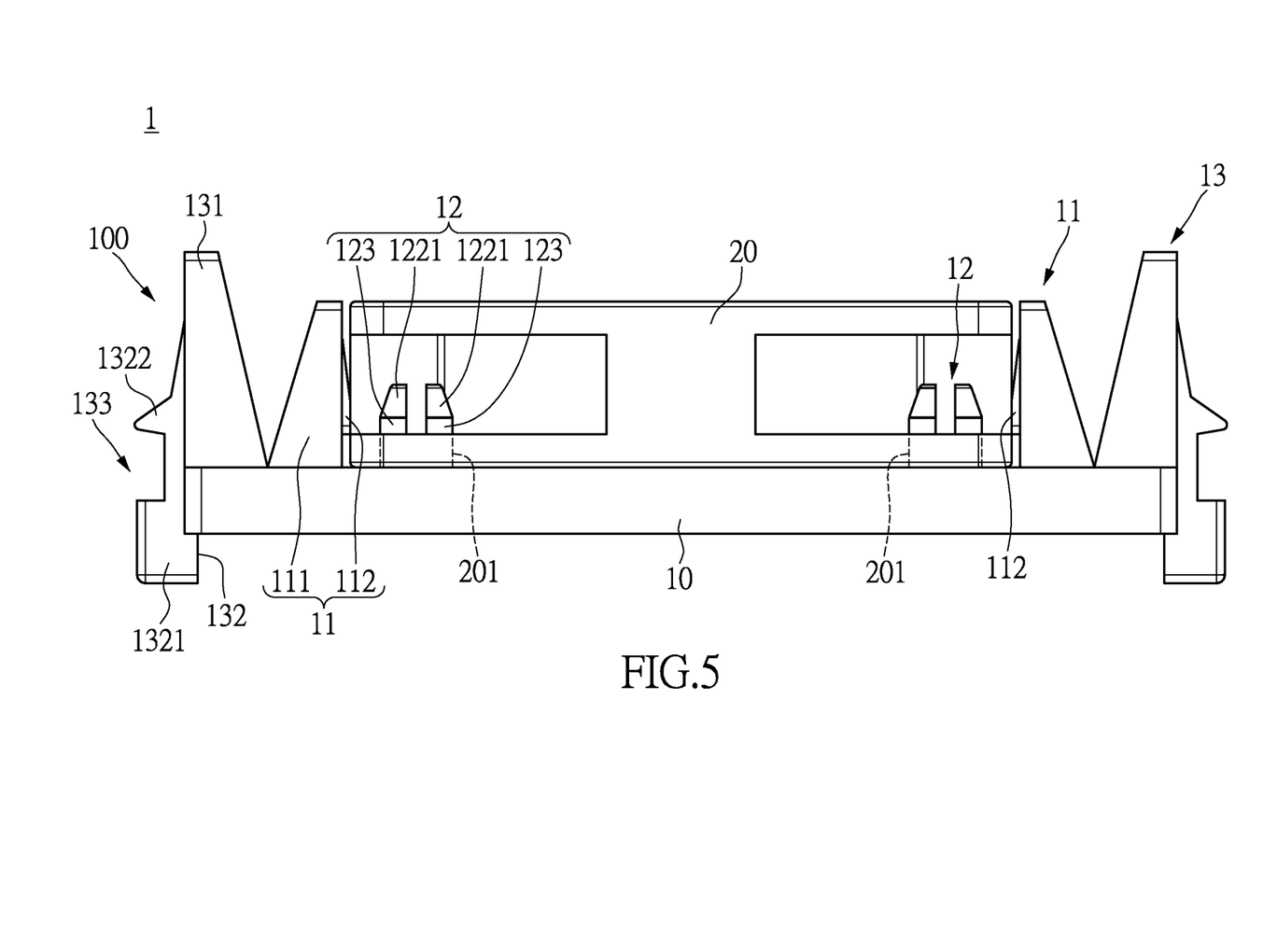
FIG. 5 shows a top view of a second assembly of the fan holding structure and the fan of the heat-dissipating module of the invention.

Referring to FIGS. 3 to 5, FIGS. 3 to 5 show top views of the fan holding structure and the fan of the heat-dissipating module. In FIG. 3, a distance L1 between the two exposed resilient clamping arms 112 opposing one another is slightly less than a length L2 (i.e. a width of the fan 20) between two opposing sidewalls of the fan 20. An outer diameter D1 of a portion of each resilient fixing member 12 that has no guiding surface 1221 is slightly larger than an inner diameter D2 of one of the corresponding mounting holes 201 of the fan 20, and the smallest outer diameter D3 of a portion of each resilient fixing member 12 that has guiding surface 1221 is equal to or slightly less than an inner diameter D2 of the corresponding mounting hole 201 of the fan 20. It should be particularly noted that in practical applications, the outer diameter D1 of the portion of each resilient fixing member 12 that has no guiding surface 1221 can be slightly larger than the sum of the inner diameter D2 of the mounting hole 201 of the fan 20 and a positive tolerance thereof, while the distance L1 between the two opposing resilient clamping arms 112 can be slightly less than the sum of the length L2 between the two opposing sidewalls of the fan 20 and a negative tolerance thereof.

In FIG. 4, as the two opposing sidewalls of the fan 20 displace downwardly (in a direction towards the carrying body 10) along the guiding surfaces 1121 of the two opposing resilient clamping arms 112 during the assembly of the fan 20 on the fan holding structure 100, each resilient clamping arm 112 is pressed by one of the sidewalls of the fan 20 to move outwardly (in a direction towards side edges of the carrying body 10), and the mounting holes 201 of the fan 20 are engaged with the corresponding resilient fixing members 12 through the guiding surfaces 1221 of the resilient fixing members 12.

In assembling the fan 20 on the carrying body 10 (as shown in FIG. 5), each resilient clamping arm 112 is pressed by one of the side walls of the fan 20, so that each clamping surface 1122 is tightly fitted to one of the side walls of the fan 20 by elastic restoring force of the resilient clamping arm 112. Similarly, since the outer diameter of the portion of each resilient fixing member 12 that has no guiding surface 1221 is larger than the inner diameter of the corresponding mounting hole 201 of the fan 20, when the fan 20 is arranged on the carrying body 10, the resilient arms 123 of each resilient fixing member 12 are pressed and further forces each of the resilient arms 123 to be tightly fitted with the mounting hole 201 of the fan 20 under the effect of the elastic-restoring force of the resilient arms 123.

As described above, the fan 20 is tightly clamped and fitted with the fan holding structure 100 by the resilient clamping member 11 and the resilient fixing member 12, so that the problems of the manufacturing tolerance for the width or the length of the outer frame of the fan 20 and the manufacturing tolerance for the mounting holes 201 of the fan 20 in the prior art can be eliminated. Furthermore, due to the resiliency of each resilient clamping member 11 and each resilient fixing member 12, the fan 20 can be tightly fitted with the fan holding structure 100, thereby effectively reducing the vibration and noise generated by the fan 20 in operation. In addition, the vibration energy generated by the fan 20 in operation can be transferred to the carrying body 10 through the resilient fixing members 12. Moreover, through the absorption of the vibration energy by the carrying body 10 that has a relative larger mass, the noise caused by the vibration of the fan 20 is effectively prevented.

In FIG. 5, when it is desired to detach the fan 20 from the fan holding structure 100, one or both of the clamping frames 111 is flipped towards a direction away from the fan 20 as the fan 20 is pulled upwardly, the fan 20 can be quickly detached from the fan holding structure 100. Referring to FIG. 2 again, preferably, at least one supporting rib 113 is arranged on a side of the clamping frame 111 opposite to the side where the resilient clamping arm 112 is exposed, thereby reinforcing the mechanical strength of the clamping frame 111.

Figure 6:
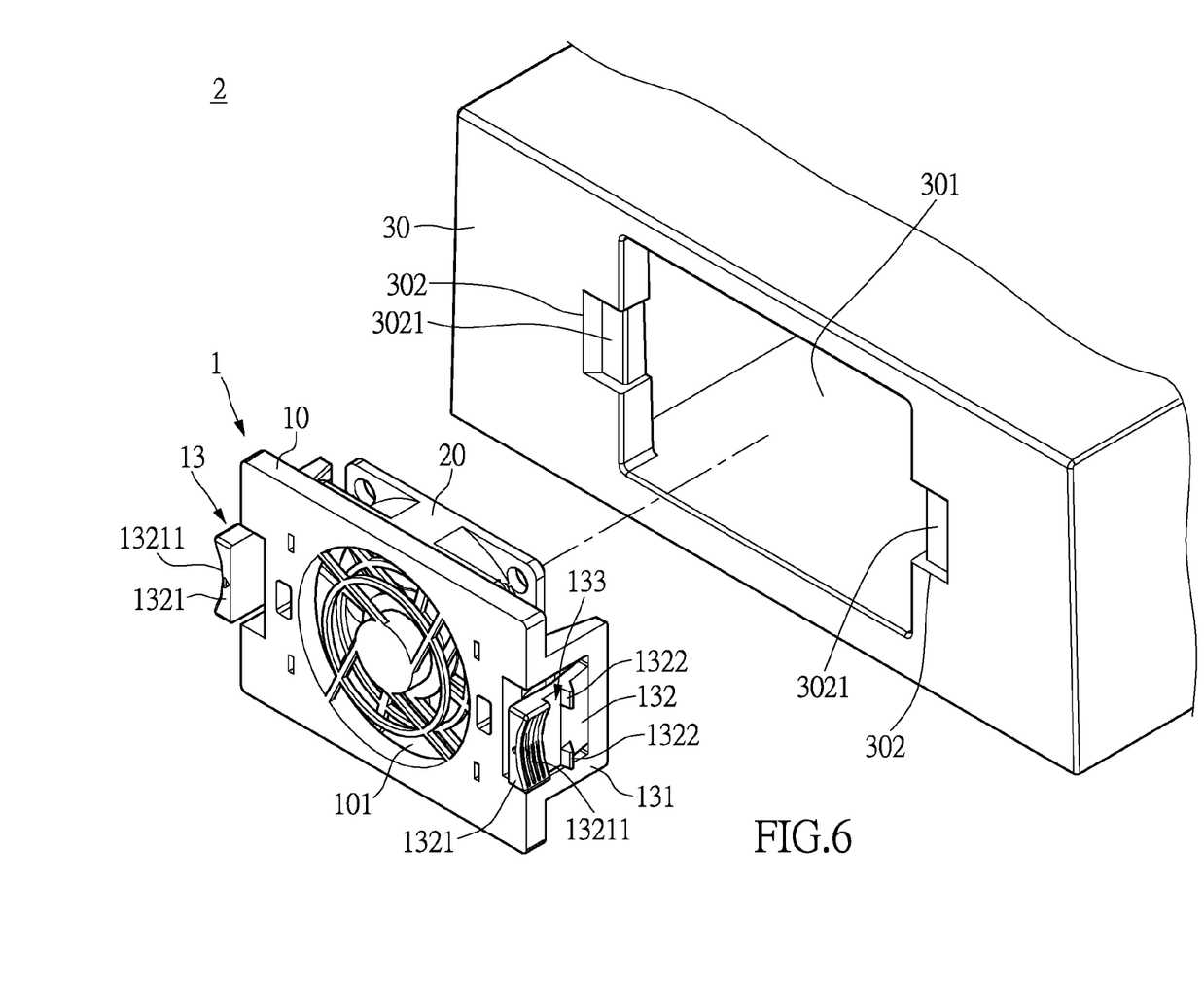
FIG. 6 shows an exploded schematic diagram of the heat-dissipating module and a housing of an electronic device of the invention.
Figure 7:
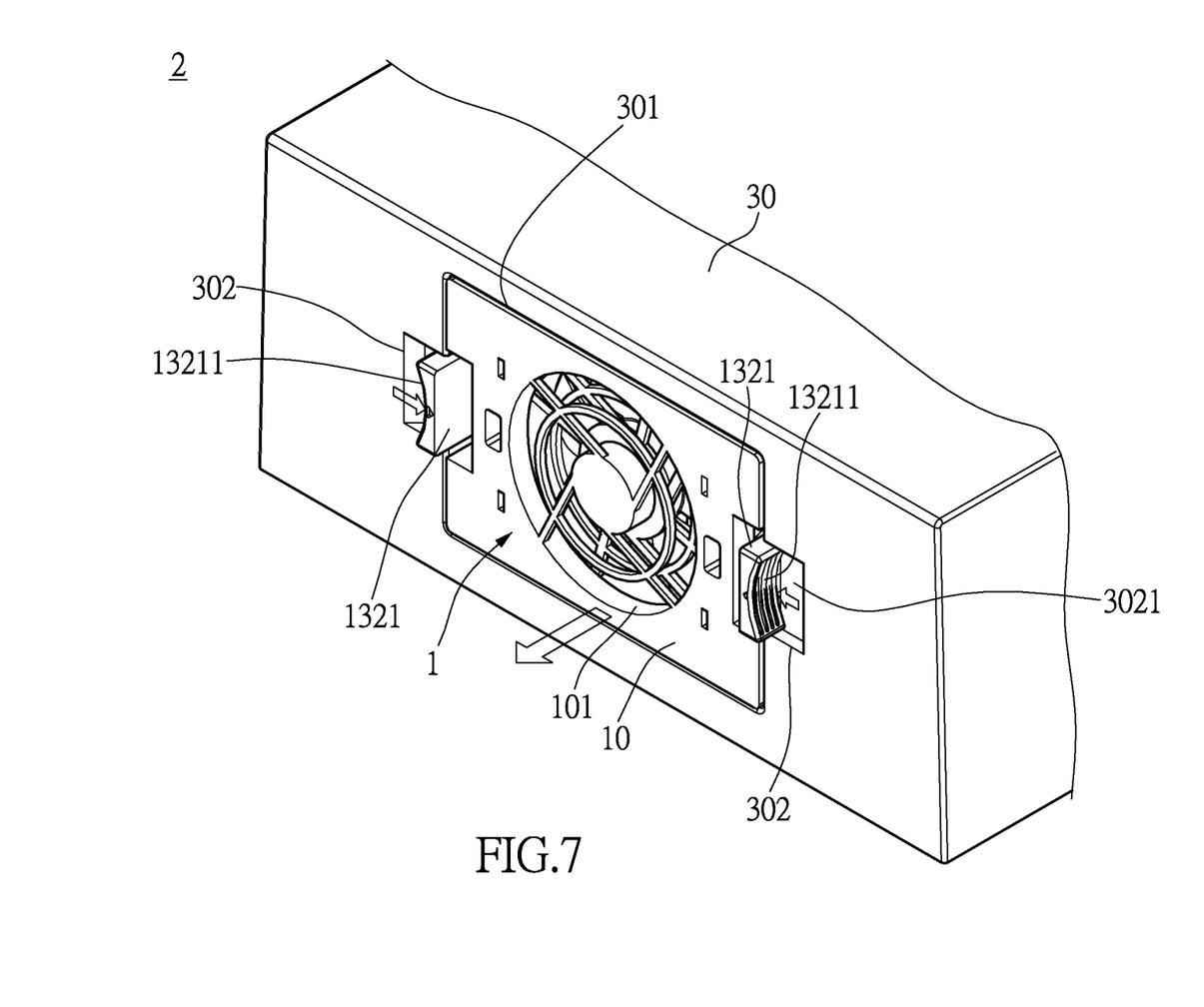
FIG. 7 shows an assembled schematic diagram of the housing of the electronic device having the heat-dissipating module of the invention.
Figure 8:
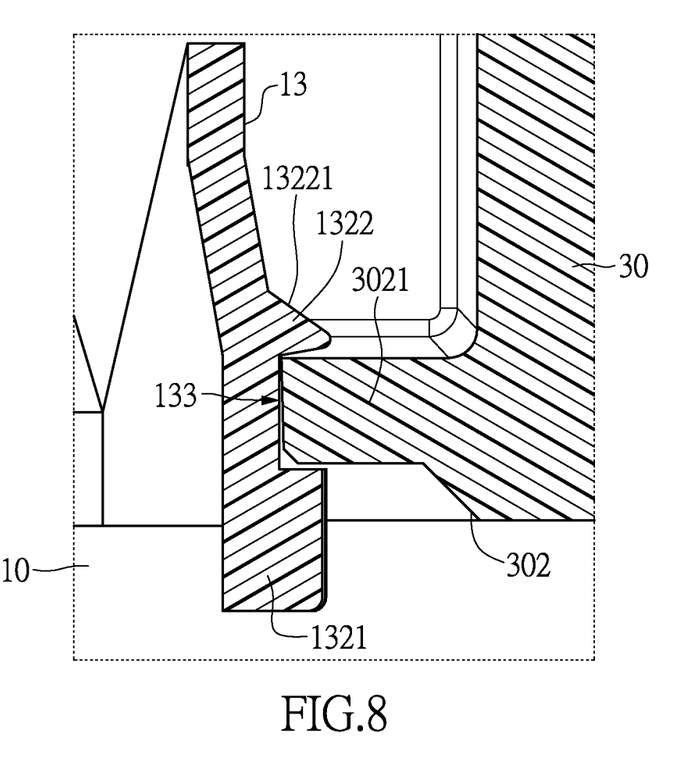
FIG. 8 shows a partial cross-sectional view of the engagement of resilient engaging members of the fan holding structure and an engaging portion of the housing of the electronic device of the invention.

Referring to FIGS. 6 to 8 together, FIGS. 6 to 8 show schematic diagrams of aforementioned the heat-dissipating module assembled onto an electronic device according to the present invention. In FIGS. 6 and 7, the electronic device 2 has a heat-dissipating module 1 and a housing 30. The heat-dissipating module 1 is detachably arranged on the housing 30. For example, the electronic device 2 can be a server, industrial computer or the like. The detailed structure of the heat-dissipating module 1 has been discussed in the above paragraphs and will not be repeated herein, and only the structure and assembly process of assembling the heat-dissipating module 1 and the housing 30 is described hereinafter.

The housing 30 includes an opening 301 and at least one engaging member 302 that is arranged around the opening 301. Preferably, the shape and size of the opening 301 correspond to those of the fan holding structure 100. The engaging member 302 further includes an engaging protrusion 3021, and the thickness of the engaging protrusion 3021 is equal to or slightly less than the width of the engaging slot 133 (see the cross-sectional view of FIG. 8). In the instant embodiment, the housing 30 includes two engaging members 302 as exemplified in FIG. 6, and the two engaging members 302 are arranged opposed to each other on the side edges of the opening 301. The two engaging members 302 respectively correspond to the two opposing resilient engaging members 13 of the aforementioned fan holding structure 100. In other words, the opening 301 of the housing 30 and the fan holding structure 100 respectively have the engaging members 302 and the resilient engaging members 13 that correspond to each other, thus, the fan holding structure 100 can be correspondingly engaged with the engaging members 302 of the housing 30 through the resilient engaging members 13. When the user desires to attach the heat-dissipating module 1 at the opening 301 of the housing 30, the front end of the resilient engaging members 13 partially enters the engaging members 302 of the housing 30, the guiding surface 13221 of each of the engaging portions 1322 abuts against the engaging protrusion 3021 corresponding to one of the engaging members 302 in order to press the resilient engaging arms 132 towards the central axis of the carrying body 10. However, in other embodiments, the engaging protrusions 3021 of the housing 30 can have a guiding surface (not shown), while the resilient engaging members 13 of the fan holding structure 100 does not have a guiding surface. It should be noted that the design of the engagement between the engaging members 302 of the housing 30 and the resilient engaging members 13 of the fan holding structure 100 can be changed according to the practical requirements and is not limited to examples provided in the instant embodiment, as long as the fan holding structure 100 can be resiliently engaged with the housing 30.

Referring to FIG. 8, a partial cross-sectional view of the engagement of the resilient engaging member 13 of the fan holding structure 100 and the engaging member 302 of the housing 30 is shown. When each resilient engaging member 13 is completely engaged in the corresponding engaging member 302 of the housing 30, the engaging protrusion 3021 of each engaging member 302 is correspondingly engaged and limited in the engaging slot 133 of each resilient engaging member 13, and the other side of the engaging portion 1322 opposite to the guiding surface 13221 abuts against the engaging protrusion 3021, so that the fan holding structure 100 is securely engaged with the housing 30 of the electronic device 2. Furthermore, the vibration energy generated by the fan 20 in operation can be transferred to the housing 30 in addition to the carrying body 10, so that the vibration energy is further absorbed, thereby effectively reducing the noise caused by the vibration of the fan 20 in operation.

Referring to FIG. 7 again, when the user desires to detach the heat-dissipating module 1 from the housing 30 of the electronic device 2, the engaging slots 133 of the resilient engaging members 13 is disengaged from the engaging protrusions 3021 of the housing 30 by directly pressing the pressing portions 1321 of the two resilient engaging members 13 at the same time (following the direction given by arrows shown in FIG. 7), so that the heat-dissipating module 1 can be detached from the housing 30. To sum up, the heat-dissipating module 1 can be easily and quickly detached from or assembled on the housing 30 of the electronic device 2 by the resilient engaging members 13 and the engaging member 302.

Improvements of the Embodiments

In view of the above, the invention improves in that: the user can quickly detach the heat-dissipating module from the housing by pressing the resilient engaging members arranged on two side edges of the carrying body; after the heat-dissipating module is detached from the housing, the fan can be quickly detached from the fan holding structure by pulling the resilient clamping member of the fan holding structure; after the fan is detached, a new fan can be tightly fitted in the fan holding structure by directly aligning the mounting holes of the fan with the resilient fixing members of the fan holding structure and then pressing the fan. Similarly, after the resilient engaging members of the fan holding structure are respectively aligned with the engaging members of the housing, the resilient engaging members are engaged in the housing by pressing, thereby completing the replacement of the fan. In this manner, the fan can be quickly replaced, and in the replacement process, no removal tools are needed and no screws are needed, thus, the user can simply and quickly finish the replacement of the fan/heat-dissipating module.

Additionally, through the resilient characteristics of the resilient clamping members and the resilient fixing members of the fan holding structure, the resilient clamping members and the resilient fixing members are pressed to generate resilience when the fan is attached on the fan holding structure, so that the fan is tightly fitted with the fan holding structure, the manufacturing tolerance for the width or the length of the outer frame of the fan and the manufacturing tolerance for the mounting holes in the art can be effectively eliminated. As a result, the fan can be securely arranged on the fan holding structure without any looseness. Furthermore, through the engagement of the resilient fixing members and the clamping of the resilient clamping members, the axial and radial displacements can be limited. In addition, through the guiding of the resilient fixing members, the vibration energy generated by the fan in operation can be transferred to the carrying body and the housing, so that the vibration energy is absorbed, thereby effectively reducing the noise generated by the vibration of the fan in operation.

The descriptions illustrated supra set forth simply the preferred embodiments of the present invention; however, the characteristics of the present invention are by no means restricted thereto. All changes, alterations, or modifications considered by those skilled in the art are deemed to be encompassed within the scope of the present invention delineated by the following claims.

What is claimed is:

1. A heat-dissipating module, comprising:
a fan holding structure, comprising:
   a carrying body, having a vent;
   at least one resilient clamping member, arranged on the carrying body at a peripheral portion of the vent, and extending vertically from a surface of the carrying body; wherein the at least one resilient clamping member includes a clamping frame and a resilient clamping arm; wherein the clamping frame is fixedly arranged on the carrying body, and one end of the resilient clamping arm is disposed on the clamping frame, whereas the other end is freely exposed from a side of the clamping frame in a direction towards a central axis of the carrying body; and
   a plurality of resilient fixing members, arranged on the carrying body at a peripheral portion of the vent, and extending vertically from the surface of the carrying body; and
a fan, having a plurality of mounting holes corresponding to the resilient fixing members of the carrying body;
wherein when the fan is assembled on the carrying body, each of the resilient fixing members is correspondingly engaged in one of the mounting holes of the fan, and the at least one resilient clamping member is abutted against a sidewall of the fan.

2. The heat-dissipating module according to claim 1, wherein the number of the at least one resilient clamping member is two, and the fan is clamped between the two resilient clamping members.

3. The heat-dissipating module according to claim 2, wherein the portion of the resilient clamping arm exposed from the side of the clamping frame includes a guiding surface and a clamping surface; wherein a length between the two opposing clamping surfaces is smaller than a distance between two opposing side edges of the fan.

4. The heat-dissipating module according to claim 3, wherein the clamping frame further includes at least one supporting rib arranged on the other side of the clamping frame.

5. The heat-dissipating module according to claim 1, wherein an outer diameter of each resilient fixing member is larger than an inner diameter of the corresponding mounting hole of the fan, and each resilient fixing member has a fixed end and a free end, the fixed end is fixedly arranged on the carrying body, the free end has a guiding surface.

6. The heat-dissipating module according to claim 5, wherein each resilient fixing member has at least two resilient fixing arms arranged with a gap arranged therebetween.

7. The heat-dissipating module according to claim 6, wherein each resilient fixing member is consisted of two resilient fixing arms having a gap arranged therebetween and each of the resilient fixing arms has a semi-cylindrical shaped pillar structure.

8. The heat-dissipating module according to claim 5, wherein the resilient fixing members are spaced from each other and symmetrically arranged on the carrying body, the number of the resilient fixing members being four, which are respectively arranged on four corners of the carrying body proximate to the vent.

9. The heat-dissipating module according to claim 6, further comprising at least one resilient engaging member arranged on a side edge of the carrying body, the heat-dissipating module being detachably arranged on a housing of an electronic device through the resilient engaging member.

10. The heat-dissipating module according to claim 9, wherein the at least one resilient engaging member includes an engaging fixing frame and a resilient engaging arm, the engaging fixing frame is fixedly arranged on the side edge of the carrying body, and the resilient engaging arm is resiliently arranged on the engaging fixing frame, a portion of the resilient engaging arm is exposed from a side of the engaging fixing frame and the side edge of the carrying body, the engaging fixing frame includes at least one supporting rib arranged on the other side of the engaging fixing frame.

11. The heat-dissipating module according to claim 10, wherein the resilient engaging arm includes an engaging portion protruded from the resilient engaging arm and a pressing portion, an engaging slot is formed between the engaging portion and the pressing portion, the engaging portion has a guiding surface.

12. An electronic device, comprising:
a housing, having an opening and at least one engaging member arranged around the opening; and
a heat-dissipating module, detachably arranged at the opening of the housing, the heat-dissipating module comprising:
a fan holding structure, comprising:
a carrying body, having a vent;
at least one resilient clamping member, arranged on the carrying body, and extending vertically from a surface of the carrying body; wherein the at least one resilient clamping member includes a clamping frame and a resilient clamping arm, wherein the clamping frame is fixedly arranged on the carrying body, and one end of the resilient clamping arm is arranged on the clamping frame, whereas the other end is freely exposed from a side of the clamping frame in a direction towards a central axis of the carrying body;
a plurality of resilient fixing members, arranged on the carrying body, and extending vertically from the surface of the carrying body; and
at least one resilient engaging member, arranged on a side edge of the carrying body; and
a fan, having a plurality of mounting holes corresponding to the resilient fixing members, wherein each of the resilient fixing members is correspondingly engaged in one of the mounting holes of the fan when the fan is arranged on the carrying body, and the at least one resilient clamping member is abutted against a sidewall of the fan;
wherein the heat-dissipating module is selectively engaged with the housing through the cooperation of the resilient engaging members and the engaging portion of the housing.

13. The electronic device according to claim 12, wherein the clamping frame further includes at least one supporting rib arranged on the other side of the clamping frame.

14. The electronic device according to claim 13, wherein the number of the at least one resilient clamping member is two, and the fan is clamped between the two resilient clamping members.

15. The electronic device according to claim 14, wherein the portion of the resilient clamping arm exposed from the clamping frame includes a guiding surface and a clamping surface, and a length between the two opposing clamping surfaces is smaller than a distance between the two opposing side edges of the fan.

16. The electronic device according to claim 12, wherein an outer diameter of each resilient fixing member is larger than an inner diameter of the corresponding mounting hole of the fan, and each resilient fixing member has a fixed end and a free end, the fixed end is fixedly arranged on the carrying body, the free end has a guiding surface.

17. The electronic device according to claim 16, wherein each resilient fixing member includes at least two resilient fixing arms having a gap arranged therebetween.

18. The electronic device according to claim 12, wherein the at least one resilient engaging member includes an engaging fixing frame and a resilient engaging arm, the engaging fixing frame is fixedly arranged on the side edge of the carrying body, and the resilient engaging arm is resiliently arranged on the engaging fixing frame, a portion of the resilient engaging arm is exposed from a side of the engaging fixing frame and the side edge of the carrying body, the engaging fixing frame includes at least one supporting rib arranged on the other side of the engaging fixing frame.

19. The electronic device according to claim 18, wherein the resilient engaging arm includes an engaging portion protruding from the resilient engaging arm and a pressing portion, an engaging slot is formed between the engaging portion and the pressing portion, the engaging portion has a guiding surface.

20. The electronic device according to claim 12, wherein the at least one engaging member further includes an engaging protrusion, the engaging protrusion has a thickness equal to or less than a width of the engaging slot of the at least one resilient engaging member, and the engaging slot of the fan holding structure is correspondingly engaged with the engaging protrusion when the heat-dissipating module is fixedly arranged on the housing.

21. A fan holding structure adapted to retain a fan, comprising:
a carrying body, having a vent;
at least one resilient clamping member, arranged on the carrying body at a peripheral portion of the vent, and extending vertically from a surface of the carrying body;
a plurality of resilient fixing member, arranged at a peripheral portion of the vent and extending vertically from the surface of the carrying body; and
at least one resilient engaging member, arranged on a side edge of the carrying body;
wherein the at least one resilient clamping member includes a clamping frame and a resilient clamping arm, wherein the clamping frame is fixedly arranged on the carrying body, and one end of the resilient clamping arm is arranged on the clamping frame, whereas the other end is freely exposed from a side of the clamping frame in a direction towards a central axis of the carrying body.

* * * * *